United States Patent
Pedron et al.

(10) Patent No.: US 10,899,626 B2
(45) Date of Patent: Jan. 26, 2021

(54) FLUIDIZED BED REACTOR AND METHOD FOR PRODUCING GRANULAR POLYSILICON

(71) Applicant: WACKER CHEMIE AG, Munich (DE)

(72) Inventors: Simon Pedron, Burghausen (DE); Gerhard Forstpointner, Kastl (DE)

(73) Assignee: WACKER CHEMIE AG, Munich (DE)

( * ) Notice: Subject to any disclaimer, the term of this patent is extended or adjusted under 35 U.S.C. 154(b) by 1139 days.

(21) Appl. No.: 14/889,347

(22) PCT Filed: Apr. 28, 2014

(86) PCT No.: PCT/EP2014/058588
§ 371 (c)(1),
(2) Date: Nov. 5, 2015

(87) PCT Pub. No.: WO2014/180693
PCT Pub. Date: Nov. 13, 2014

(65) Prior Publication Data
US 2016/0101982 A1    Apr. 14, 2016

(30) Foreign Application Priority Data
May 6, 2013   (DE) .......................... 10 2013 208 274

(51) Int. Cl.
*B01J 4/00* (2006.01)
*B01J 8/18* (2006.01)
(Continued)

(52) U.S. Cl.
CPC .............. *C01B 33/03* (2013.01); *B01J 4/002* (2013.01); *B01J 4/004* (2013.01); *B01J 4/008* (2013.01); *B01J 8/0015* (2013.01); *B01J 8/1818* (2013.01); *B01J 8/1827* (2013.01); *B01J 8/1836* (2013.01); *B01J 8/1872* (2013.01); *B01J 8/24* (2013.01); *C01B 33/027* (2013.01); *C23C 16/24* (2013.01); *C23C 16/442* (2013.01); *B01J 2208/00752* (2013.01); *B01J 2208/00761* (2013.01);
(Continued)

(58) Field of Classification Search
None
See application file for complete search history.

(56) References Cited

U.S. PATENT DOCUMENTS 2,868,590 A * 1/1959 Allen ...................... B65G 53/58
                                                              406/144
3,365,242 A * 1/1968 Marchetti ............... C12B 5/003
                                                              266/183
(Continued)

FOREIGN PATENT DOCUMENTS

CN     101432470 A    5/2009
CN     201390803 Y    1/2010
(Continued)

OTHER PUBLICATIONS

Machine translation for JP 02-030611 A (Feb. 1990).*

Primary Examiner — Jennifer A Leung
(74) Attorney, Agent, or Firm — Brooks Kushman P.C.

(57) ABSTRACT

The fluidized bed process for preparing polysilicon by chemical vapor deposition is improved by positioning at least one Laval nozzle upstream from a gas inlet into the reactor.

16 Claims, 5 Drawing Sheets

(51) Int. Cl.
*C01B 33/03* (2006.01)
*C01B 33/027* (2006.01)
*B01J 8/00* (2006.01)
*B01J 8/24* (2006.01)
*C23C 16/24* (2006.01)
*C23C 16/442* (2006.01)

(52) U.S. Cl.
CPC ............ *B01J 2208/00902* (2013.01); *B01J 2208/00911* (2013.01); *B01J 2208/065* (2013.01)

(56) References Cited

U.S. PATENT DOCUMENTS

| | | | |
|---|---|---|---|
| 4,014,577 A * | 3/1977 | Clancy | B65G 53/66 |
| | | | 137/118.02 |
| 4,786,477 A | 11/1988 | Yoon et al. | |
| 5,382,412 A * | 1/1995 | Kim | B01J 8/1854 |
| | | | 118/50.1 |
| 5,397,062 A * | 3/1995 | Krambrock | G05D 7/01 |
| | | | 137/494 |
| 5,489,166 A * | 2/1996 | Schmit | B01J 8/003 |
| | | | 34/360 |
| 6,007,869 A | 12/1999 | Schreieder et al. | |
| 6,682,705 B1 | 1/2004 | Gross et al. | |
| 7,029,632 B1 * | 4/2006 | Weidhaus | B01J 8/1818 |
| | | | 165/177 |
| 7,490,785 B2 | 2/2009 | Weidhaus | |
| 7,850,102 B2 | 12/2010 | Meier et al. | |
| 7,922,990 B2 | 4/2011 | Hertlein et al. | |
| 8,821,827 B2 | 9/2014 | Kim et al. | |
| 2002/0086530 A1 * | 7/2002 | Kim | C01B 33/027 |
| | | | 438/687 |
| 2003/0209266 A1 * | 11/2003 | Dupuis | B29C 49/783 |
| | | | 137/115.04 |
| 2007/0040056 A1 | 2/2007 | Weidhaus | |
| 2008/0220166 A1 | 9/2008 | Ege et al. | |
| 2008/0241046 A1 * | 10/2008 | Hertlein | C01B 33/027 |
| | | | 423/349 |
| 2008/0299291 A1 | 12/2008 | Weidhaus et al. | |
| 2009/0324479 A1 | 12/2009 | Kulkarni et al. | |

FOREIGN PATENT DOCUMENTS

| | | |
|---|---|---|
| CN | 202460597 U | 10/2012 |
| DE | 752280 A | 5/1953 |
| DE | 197 22 570 A1 | 12/1998 |
| EP | 0 896 952 A1 | 2/1999 |
| EP | 1 205 435 A1 | 5/2002 |
| JP | 02030611 A * | 2/1990 |
| JP | 11181514 A * | 7/1999 |
| JP | 2009502704 A | 1/2009 |
| JP | 2011526877 A | 10/2011 |
| KR | 20070021923 A | 2/2007 |
| KR | 20080039911 A | 5/2008 |
| WO | 2008018760 A1 | 2/2008 |

* cited by examiner

FLUIDIZED BED REACTOR AND METHOD FOR PRODUCING GRANULAR POLYSILICON

CROSS REFERENCE TO RELATED APPLICATIONS

This application is the U.S. National Phase of PCT Appln. No. PCT/EP2014/058588 filed Apr. 28, 2014, which claims priority to German Application No. 10 2013 208 274.6 filed May 6, 2013, the disclosures of which are incorporated in their entirety by reference herein.

BACKGROUND OF THE INVENTION

1. Field of the Invention

The invention relates to a fluidized bed reactor and a method for producing granular polysilicon.

2. Description of the Related Art

Polycrystalline silicon granules or "polysilicon granules" for short, is an alternative to the polysilicon produced in the Siemens process. While the polysilicon in the Siemens process is obtained as a cylindrical silicon rod which has to be comminuted prior to further processing thereof in a time-consuming and expensive manner to give what is called chip poly and may again have to be purified, polysilicon granules have bulk material properties and can be used directly as a raw material, e.g. for single crystal production for the photovoltaics and electronics industries.

Polysilicon granules are produced in a fluidized bed reactor. This is achieved by fluidizing silicon particles by means of a gas flow in a fluidized bed, the fluidized bed being heated to high temperatures by means of a heating device. Addition of a silicon-containing reaction gas results in a pyrrolysis reaction on the hot particle surface. In the process, elemental silicon deposits on the silicon particles and the individual particles grow in diameter. By the regular withdrawal of particles that have grown and addition of smaller silicon particles as seed particles, (hereinafter in this document termed "seed"), the method can be operated continuously with all of the associated advantages. As silicon-containing reactant gases, silicon-halogen compounds (e.g. chlorosilanes or bromosilanes), monosilane ($SiH_4$), and mixtures of these gases with hydrogen or other inert gases, for example nitrogen, are described. Such deposition methods and devices for this purpose are known, for example, from U.S. Pat. No. 4,786,477 A.

U.S. Pat. No. 7,922,990 B2 describes a fluid bed reactor which comprises: a pressure-bearing casing, an inner reactor tube made of a material which has a high transmission for thermal radiation, an inlet for silicon particles, an inlet device for feeding a reaction gas which contains a gaseous or vaporous silicon compound, a gas distributor for supplying a fluidizing gas, an outlet for unreacted reaction gas, fluidizing gas and also the gaseous or vaporous products of the reaction which accumulate above the fluidized bed surface, an outlet for the product, a heating device and an energy supply for the heating device. For example, it is disclosed that in a pressure-resistant steel vessel having an internal diameter of 770 mm, the inner reactor tube, a quartz tube of 600 mm internal diameter and 2200 mm in length is situated. At the lower end of the quartz tube, a plate made of quartz and furnished with openings forms the gas distributor for the fluidizing gas. 4 further quartz tubes of 20 mm internal diameter and 250 mm in length arranged in a central circle having a diameter of 250 mm project from the gas distributor plate into the inner reactor tube as inlet devices for supplying the silicon-containing gas or gas mixture. In addition, the quartz plate is provided with two openings for removal of product.

US 2008/0299291 A1 discloses a method for producing high-purity polysilicon granules by deposition of a reaction gas on silicon granules in a fluidized bed reactor. The reaction gas in this case is injected as one or more gas jets directed vertically upwards into the fluidized bed which is weakly fluidized by means of dilution gas, more precisely in such a manner that one or more local reaction regions form above the feed nozzles within the fluidized bed, in which local reaction regions the reaction gas reacts virtually completely to chemical equilibrium, before it reaches the fluidized bed enclosing wall or the fluidized bed surface. Preferably, the dilution gas is fed via a plurality of individual nozzles distributed as evenly as possible over the cross section of the fluidized bed. As a result, in this weakly fluidized region, a high measure of turbulence is generated, as result of which the formation of agglomerates can be effectively prevented. This is important, in particular, because the deposited product granules are also withdrawn from the fluidized bed from this region. The dilution gas is conducted via individual nozzles into the lower zone of the fluidized bed, wherein a local jet region forms at each nozzle. These individual jets dissolve upwardly to give a bubble-forming fluidized bed. The reaction gas is conducted into the reactor via one or more reaction gas feeds through the reactor base and flows at a defined height above the level of the dilution gas nozzles into the fluidized bed. As result, between the gas outlet of the reaction gas and the gas outlet of the dilution gas nozzles, a fluidized bed region forms through which only dilution gas flows. Also the dilution gas nozzles and the reaction gas feeds are fabricated from a material that is as pure as possible that contaminates the silicon granules as little as possible, preferably from high-purity quartz. The reaction gas feeds consist in each case of a central reaction gas nozzle and an annular nozzle surrounding this, in such a manner that a ring gap forms for the feed of dilution gas.

In the devices and methods mentioned at the outset, it has been found that pressure conditions varying with time in fluidized beds cause fluctuations of the gas mass streams that are fed. This leads to instabilities in the chemical process and in the temperature distribution. Locally suspended fluidization has also been observed, and as result, sintering on hot surfaces, for example. Locally fluctuating pressure conditions in the fluidized bed have the same effect, in particular when gas mass streams are fed through a plurality of openings, such as e.g. nozzles, distributed over the cross section.

For structural, processing and quality reasons, in the deposition of silicon using silanes ($SiH_nXl_{4-n}$ where X=halogen, e.g. F, Cl, I; n=0-4) in a fluidized bed reactor, it is not possible to use a conventional gas distributor plate via which all gas mass streams can be fed. The openings via which the gases are fed to the fluidized bed do not have a sufficient pressure drop for distributing the respective mass streams in a manner uniform with respect to time and locality.

U.S. Pat. No. 7,490,785 B2 discloses a device for producing silicon seed particles from silicon granules comprising a vertically arranged jet chamber having a cylindrical cross section with a jet nozzle at the base of the jet chamber, through which a milling gas stream can be introduced into the jet chamber, a countercurrent flow gravity sifter following the jet chamber directly and an inlet for silicon granules, characterized in that the jet chamber has a length which is sufficient for an expansion of the milling gas stream to the cross section of the jet chamber, and the jet chamber has a smaller flow cross section than the countercurrent flow gravity sifter. Preferably, this is a fluidized bed jet mill. In this case, the milling gas is fed via a jet nozzle, constructed as a simple nozzle or as a Laval nozzle, which is arranged at the base of the milling chamber. The feed material is fed laterally via an inlet to the milling chamber. In the milling chamber, a fluidized bed forms of milling gas and particles in which the particles that are accelerated by the gas jet collide with other particles and disintegrate.

U.S. Pat. No. 7,850,102 B2 discloses a method for milling amorphous solids by means of a milling system (milling apparatus), preferably a milling system comprising a jet mill, characterized in that the mill is operated in the milling phase with an operating medium selected from the group consisting of gas and/or vapor, preferably steam, and/or a gas containing steam, and in that the milling chamber is heated in a heat-up phase i.e. before the actual operation with the operating medium, in such a manner that the temperature in the milling chamber and/or at the mill exit is higher than the dew point of the vapor and/or of the operating medium. The method is carried out in a milling system (milling apparatus), preferably in a milling system comprising a jet mill, particularly preferably comprising an opposed jet mill. For this purpose, a feed material that is to be comminuted is accelerated in expanding gas jets of high velocity and comminuted by particle-particle impacts. The jet mills used are very particularly preferably fluidized bed opposed jet mills or dense-bed jet mills or spiral jet mills. In the case of the very particularly preferred fluidized bed opposed jet mill, two or more milling jet inlets are situated in the lower third of the milling chamber, preferably in the form of milling nozzles, which are preferably situated in a horizontal plane. The milling nozzles used can be Laval nozzles.

The use of Laval nozzles in connection with fluidized-bed jet mills for producing seed particles for deposition of polycrystalline silicon granules by milling silicon granules is thus already known in the prior art. A Laval nozzle is a flow element having an initially convergent and subsequently divergent cross section, wherein the transition from one part to the other part proceeds gradually. The cross sectional surface at each point is said to be circular, as result of which a fluid flowing through can be accelerated to supersonic speed, without strong compression shocks occurring. The speed of sound is reached exactly in the narrowest cross section of the nozzle.

From the above described problems of the pressure conditions in the fluidized beds varying with time and/or locally in the production of polycrystalline silicon granules, there resulted the object of the invention.

SUMMARY OF THE INVENTION

The object of the invention is achieved by a fluidized bed reactor for producing granular polysilicon, which comprises a vessel having an inner reactor tube for a fluidized bed with granular polysilicon and a reactor base, a heating device for heating the fluidized bed in the inner reactor tube, at least one opening in the reactor base for feeding fluidizing gas, and at least one opening in the reactor base for feeding reaction gas, a device for removing reactor offgas, a feed appliance for feeding silicon particles, and also a withdrawal conduit for granular polysilicon, wherein a Laval nozzle is situated upstream of at least one of the openings in the reactor base outside the inner reactor tube, suitable for expanding supercritically at least one mass stream that is fed.

DETAILED DESCRIPTION OF THE PREFERRED EMBODIMENTS

Figure 1:
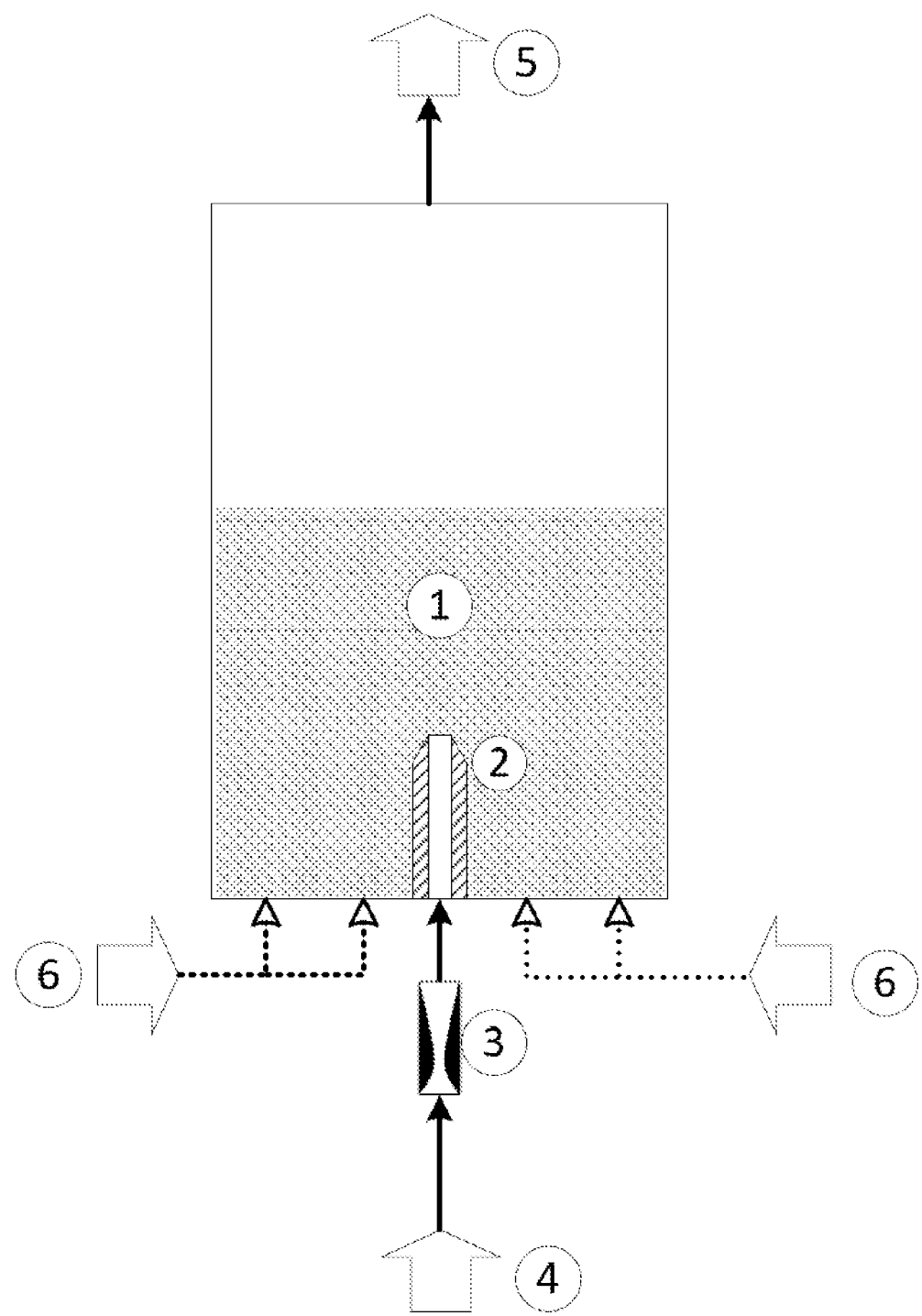
FIG. 1 shows one embodiment of the invention having an opening a Laval nozzle situated upstream.
Figure 2:
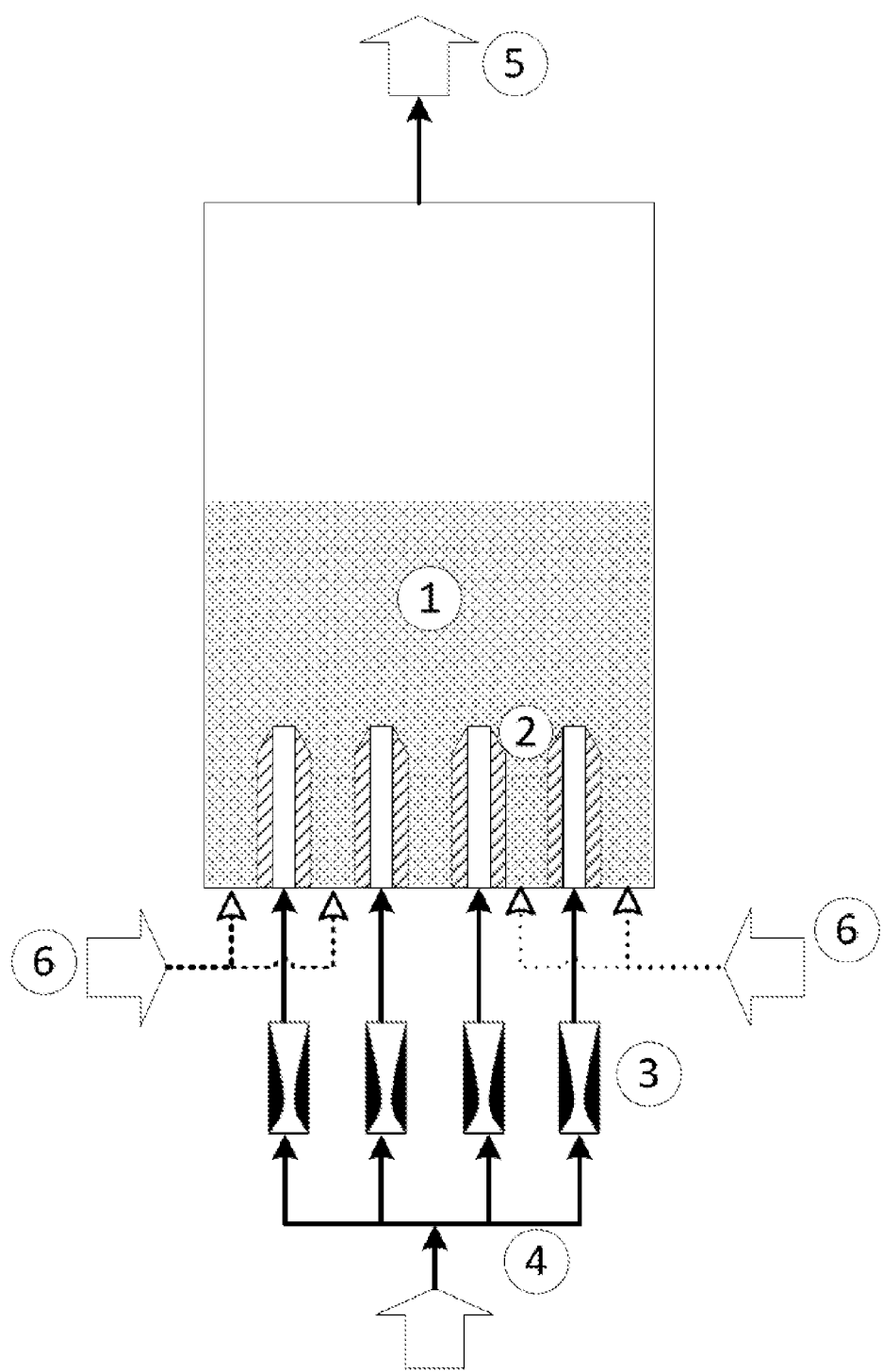
FIG. 2 shows one embodiment of the invention having two or more openings each having a Laval nozzle situated upstream.
Figure 3:
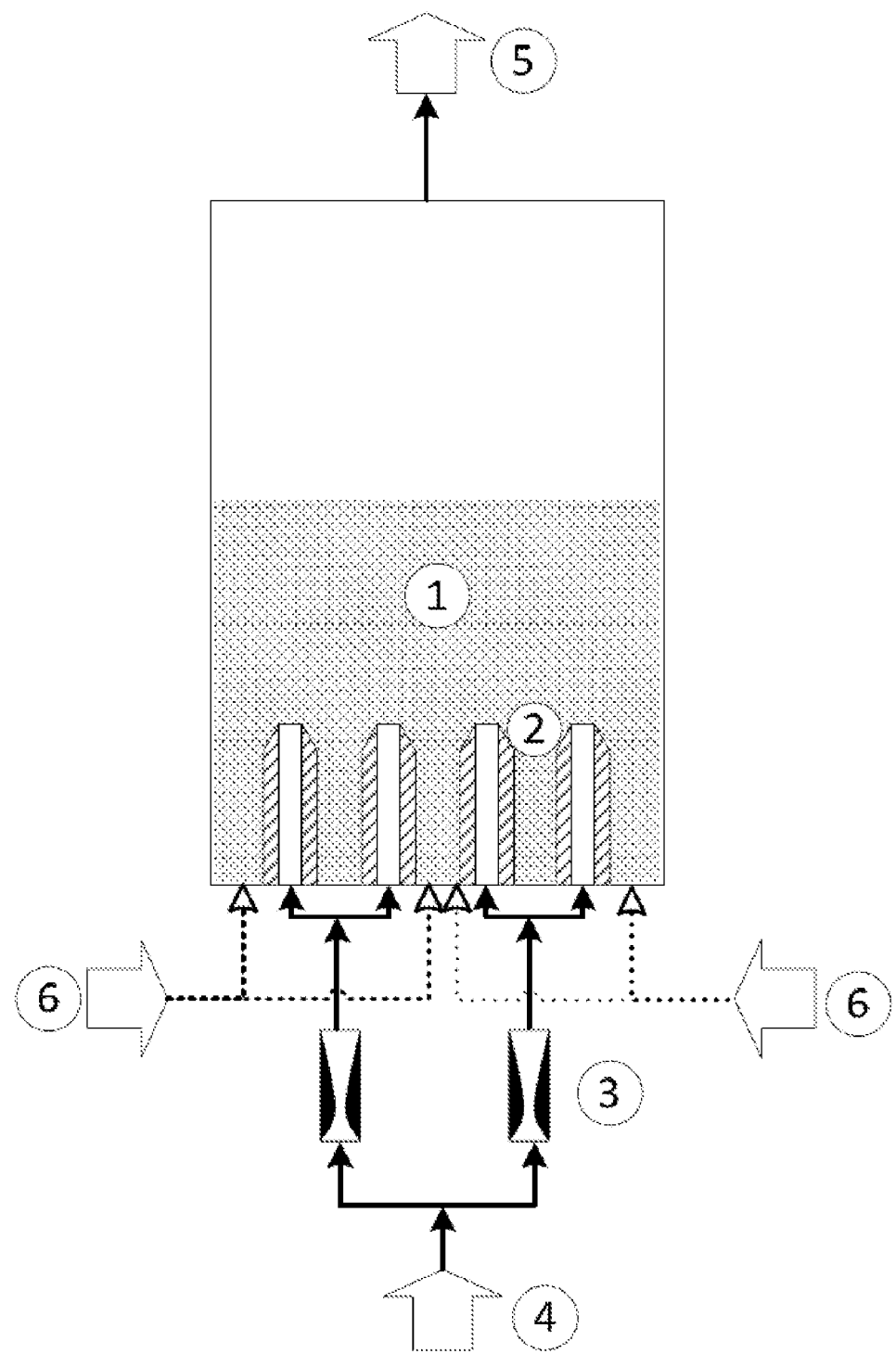
FIG. 3 shows one embodiment of the invention having one or more groups of openings, of which each group has at least two openings. A Laval nozzle is situated upstream of each group.

Preferably, the fluidized bed reactor comprises at least two openings in the reactor base each having a Laval nozzle situated upstream.

Preferably, the fluidized bed reactor comprises at least one group of openings in the reactor base, comprising at least two openings, wherein a Laval nozzle is situated upstream of the at least one group of openings in each case.

Preferably, the fluidized bed reactor comprises at least one group of openings in the reactor base, comprising in each case at least two openings, wherein in each case one Laval nozzle is situated upstream of each opening, in such a manner that at least one group of Laval nozzles comprising in each case at least two Laval nozzles results, wherein in each case one Laval nozzle is connected upstream of each at least one group of Laval nozzles.

Preferably, the at least one opening in the reactor base upstream of which a Laval nozzle is situated is a gas distributor device.

Preferably, the at least one opening in the reactor base upstream of which a Laval nozzle is situated is a hole in the base plate, a valve, or a nozzle.

The object is also achieved by a method for producing granular polysilicon in a device according to the invention or in a device according to any one of the abovementioned preferred embodiments, which comprises fluidizing silicon particles by means of a fluidizing gas in a fluidized bed which is heated via a heating device to a temperature of 850-1200° C., addition of a silicon-containing reaction gas and deposition of silicon on the silicon particles.

The invention also relates to a method for producing granular polysilicon in a fluidized bed reactor, which comprises fluidizing silicon particles by means of a fluidizing gas that is fed via at least one opening in the reactor base of the fluidized bed reactor in a fluidized bed which is heated via a heating device to a temperature of 850-1200° C., addition of a silicon-containing reaction gas which is fed via at least one opening in the reactor base of the fluidized bed reactor, and deposition of silicon on the silicon particles, wherein at least one mass stream of fluidizing gas or reaction gas that is fed is expanded supercritically.

The fluidizing gas is preferably $H_2$ and the silicon-containing reaction gas is preferably TCS.

Preferably, a Laval nozzle is situated upstream of at least one of the openings in the reactor base in order to expand supercritically the at least one mass stream that is fed, by overpressure prevailing in the Laval nozzle.

For uniform distribution of gas mass streams in fluidized beds, perforated plates having nozzle geometries, nozzle plates, valve plates or occasionally porous plates having a defined pressure drop can also be used. The pressure and mass stream fluctuations on the supply side induced by pressure fluctuations of the fluidized bed are greatly damped by the pressure drop of the gas distributor. Furthermore, circular apertures can be used in the gas feed conduits in case the pressure drop of the gas inlet openings is not sufficient.

A uniform distribution of one or more gas mass streams fed to a fluidized bed over time and all inlet openings is not ensured in the present invention via a gas distributor plate alone via the pressure drop thereof, but via Laval nozzles, which are preferably operated at a supercritical pressure ratio.

In certain fluidized bed applications, for reasons of structural, process-related or quality grounds, it is not possible to ensure the required pressure drop for gas uniform distribution via the gas distributor plate or the valves or nozzles used.

Laval nozzles situated upstream have the advantage that they can be used for such applications for harmonization of the gas mass streams that are fed in terms of time and location, without intervening in the geometry of the fluidized bed apparatuses, gas distributor plates, nozzles or valves.

The uniform distribution of at least one of the gas mass streams fed to the fluidized bed proceeds via a Laval nozzle situated upstream.

In Laval nozzles, a defined pressure drop is generated by cross section constriction and subsequent expansion. If the pressure difference between entry side and exit side increases above a certain ratio (critical pressure ratio), the fluid in the Laval nozzle is accelerated to the speed of sound in the narrowest cross section and supersonic speed on the exit side. In supercritical flow, the mass stream remains constant at constant nozzle intake pressure, i.e. pressure variations on the exit side of the Laval nozzle that are coupled to the fluidized bed apparatus do not have an effect on the mass stream passing through.

In the arrangement of the Laval nozzles and openings (for example holes in the base plates, valves or nozzles), various possibilities result which are illustrated hereinafter with reference to FIGS. 1-5.

LIST OF REFERENCE SIGNS USED

1 Fluidized bed
2 Opening for feed of a gas mass stream to the fluidized bed
3 Laval nozzle
4 Feed gas mass stream
5 Offgas mass stream
6 Other gas mass streams fed
7 Gas distributor (having a plurality of openings)

EXAMPLES

The examples hereinafter show that the gas mass stream flowing through the Laval nozzles is dependent on the inlet pressure, the nozzle diameter, the gas composition, the temperature and the number of nozzles.

The pressure p_out should preferably be selected in such a manner that a supercritical state prevails in the Laval nozzle:

$$\left(\frac{p_{out}}{p_{in}}\right) < \left(\frac{p_{out}}{p_{in}}\right)_{crit}$$

The critical pressure ratio may be calculated as follows $$\left(\frac{p_{out}}{p_{in}}\right)_{crit} = \left(\frac{2}{\kappa+1}\right)^{\frac{\kappa}{\kappa+1}}$$

In this case $\kappa$ is the isentropic coefficient of the gas which is flowing through the nozzle.

The mass stream which flows through an opening having the narrowest open cross sectional area A may be calculated as follows:

$$\dot{m} = A \cdot \sqrt{2 \cdot p_{in} \cdot \rho_{in}} \cdot \left(\frac{2}{\kappa+1}\right)^{\left(\frac{1}{\kappa-1}\right)} \cdot \sqrt{\frac{\kappa}{\kappa+1}}$$

$\rho_{in}$ here is the density of the gas on the gas entry side (pressure side).

Example 1 is the reference case. The parameters of the reference case and also of the further examples may be found in Table 1.

In Example 2, the nozzle cross section was increased. A larger nozzle cross section for the same intake pressure means more mass stream passing through, which, however, does not have an effect on p_out.

In Example 3, the gas composition was changed by the Laval nozzle. It is found that the mass stream depends greatly on the gas composition, wherein gases having a lower molar mass require a lower pressure downstream of the Laval nozzle and a smaller mass stream can be passed through.

In Example 4, the temperature was increased. This causes a decrease in the gas density and thereby likewise decreases the mass stream.

Also, lowering the intake pressure of the Laval nozzle leads to a lower gas mass stream being able to flow through the nozzle.

TABLE 1

|  | Example 1 | Example 2 | Example 3 | Example 4 | Example 5 |
| --- | --- | --- | --- | --- | --- |
| Smallest diameter of Laval nozzle [m] | 0.01 | 0.024 | 0.01 | 0.01 | 0.01 |
| x_$H_2$ [mol %] | 50 | 50 | 95 | 50 | 50 |
| x_HCl [mol %] | 0 | 0 | 5 | 0 | 0 |
| x_TCS [mol %] | 50 | 50 | 0 | 50 | 50 |
| T_in [K] | 500 | 500 | 500 | 900 | 500 |
| (p_out/p_in)_crit [—] | 0.572 | 0.572 | 0.529 | 0.575 | 0.572 |
| p_in [bar] | 10.00 | 10.00 | 10.00 | 10.00 | 5.00 |

TABLE 1-continued

|  | Example 1 | Example 2 | Example 3 | Example 4 | Example 5 |
|---|---|---|---|---|---|
| p_out [bar] | <5.72 | <5.725 | <5.29 | <5.75 | <2.86 |
| Mass stream through_individual nozzle [kg/h] | 701 | 4036 | 174 | 520 | 350 |
| n_nozzles | 3 | 3 | 3 | 3 | 3 |
| Total mass stream | 2103 | 12108 | 522 | 1560 | 1050 |

Figure 4:
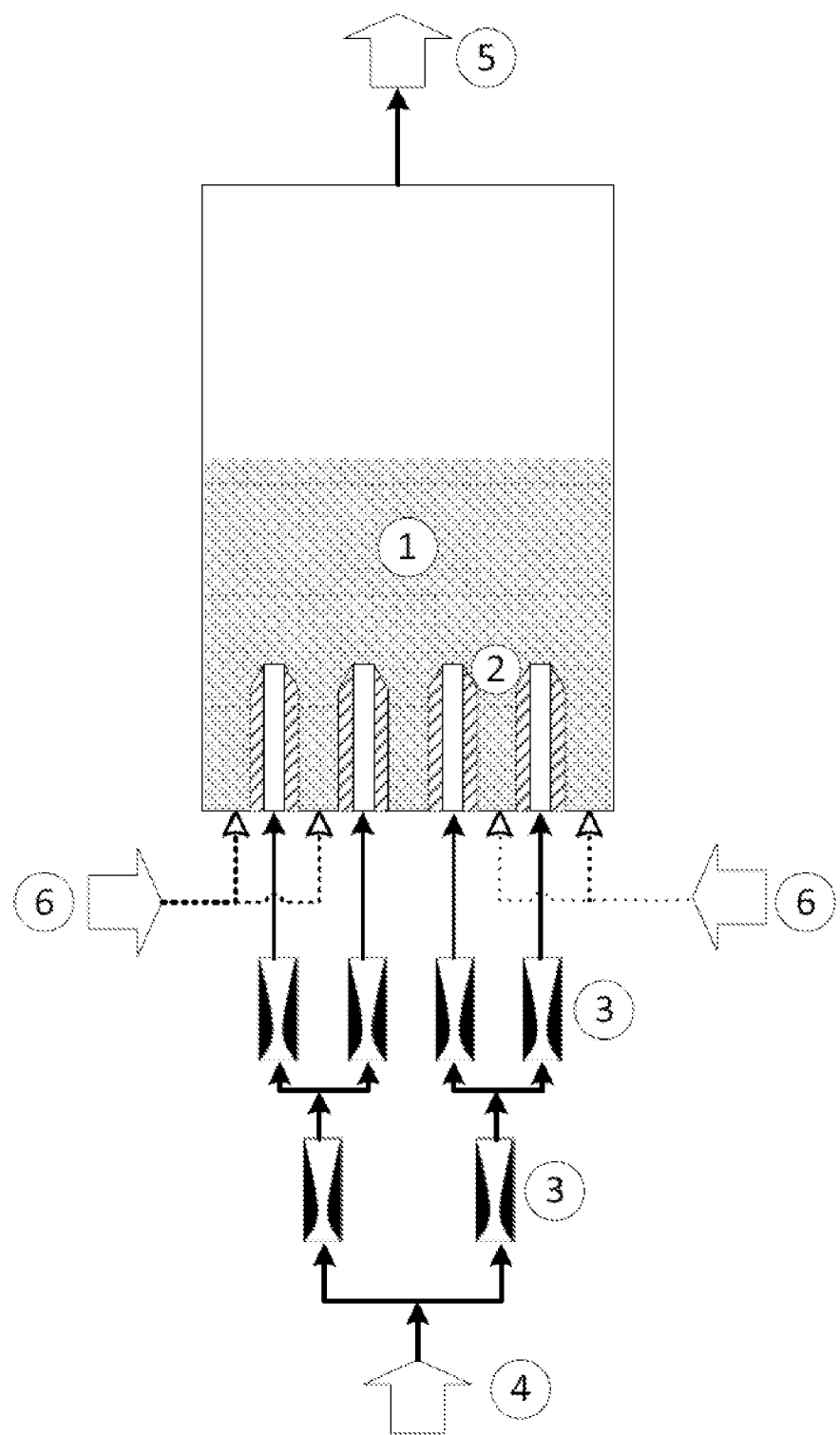
FIG. 4 shows one embodiment of the invention having two or more openings, wherein a Laval nozzle is situated upstream of each opening and which are combined to form one or more groups each having Laval nozzles situated upstream.
Figure 5:
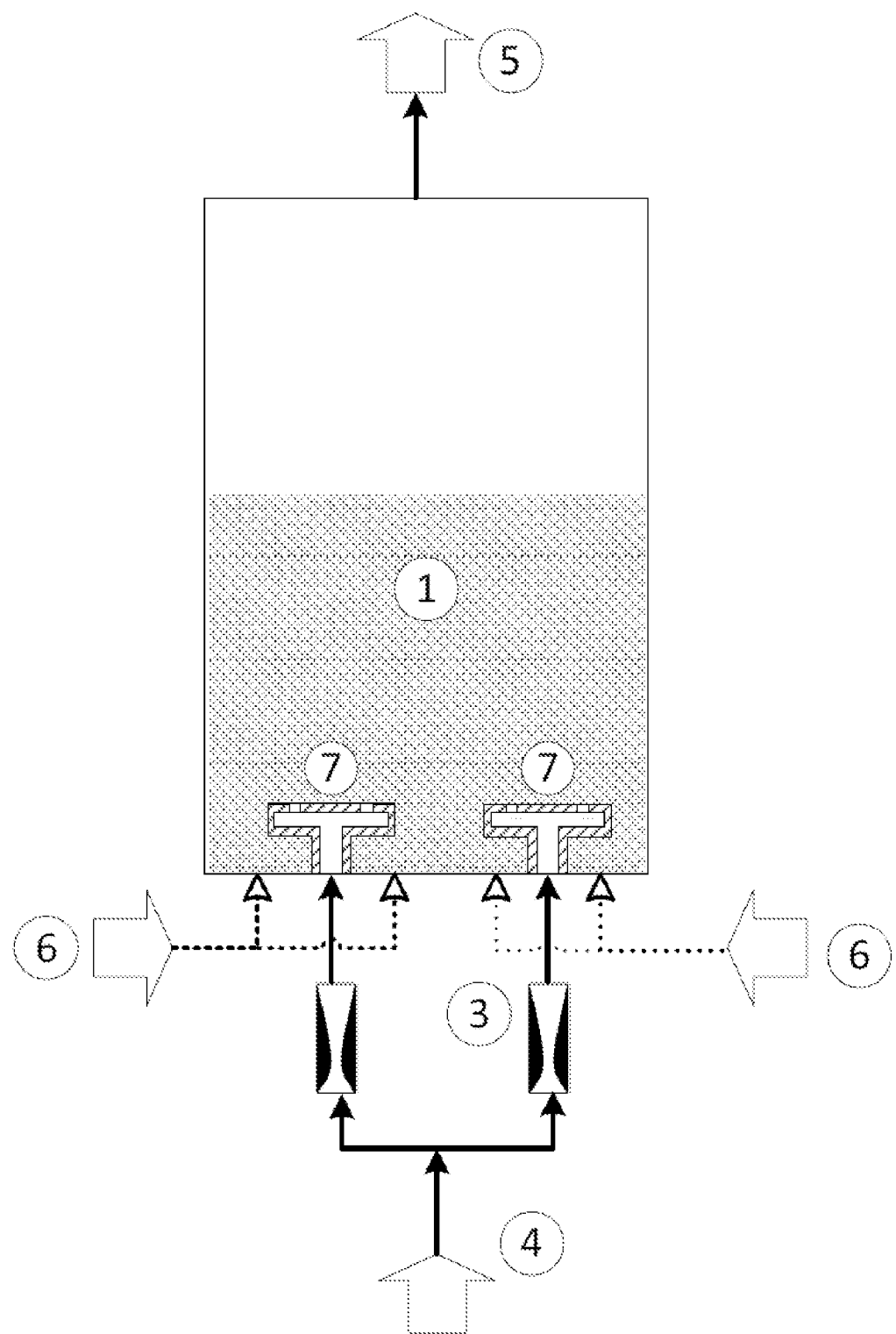
FIG. 5 shows one embodiment of the invention having one or more gas distributor devices each having two or more openings. A Laval nozzle is situated upstream of each gas distributor device.

Example 6 is based on the arrangement of FIG. 4, in which four openings each have one Laval nozzle, each two Laval nozzles are combined to form a group and in addition one further Laval nozzle is connected upstream of each group.

The pressure ratios and geometries shown in Table 2 result.

TABLE 2

|  | Example 6 |
|---|---|
| Smallest diameter of Laval nozzle upstream of group [m] | 0.01 |
| Smallest diameter of Laval nozzle upstream of opening [m] | 0.0092 |
| x_$H_2$ [mol %] | 50 |
| x_HCl [mol %] | 0 |
| x_TCS [mol %] | 50 |
| T_in [K] | 500 |
| p_in [bar] | 15 |
| p_center [bar] | <8.572 |
| p_out [bar] | <4.889 |
| Total mass stream [kg/h] | 2102 |
| Mass stream per group [kg/h] | 1051 |
| Mass stream per_opening [kg/h] | 525 |

The invention claimed is:

1. In a fluidized bed reactor for producing granular polysilicon, having an inner reactor tube for a fluidized bed of granular polysilicon, the inner reactor tube having a reactor base with openings for entry of fluidizing gas and reaction gas, a heater for heating the fluidized bed of polysilicon, a silicon particle feed, an opening above the fluidized bed for removing offgas, and an opening in the inner reactor tube for removing a granular silicon product, the improvement comprising:
at least two reaction gas openings in the reactor base, each of the at least two reaction gas openings fed by a Laval nozzle positioned outside of the reactor tube and upstream of the at least two reaction gas openings, the Laval nozzle suitable for expanding supercritically at least one mass stream of reaction gas, the at least two reaction gas openings comprising a gas distributor, a valve, a hole in the reactor base, or a nozzle, wherein the intake pressure of the Laval nozzle is controlled by gas quantity regulation.

2. The fluidized bed reactor of claim 1, wherein each reaction gas opening in the reactor base is fed by a respective Laval nozzle.

3. The fluidized bed reactor of claim 1, wherein two or more reaction gas openings in the reactor base form a reaction gas opening group, and the reaction gas opening group is commonly fed by a single Laval nozzle located upstream from the reaction gas opening group.

4. The fluidized bed reactor of claim 3, wherein two or more reaction gas opening groups are present, each group fed by a respective Laval nozzle.

5. The fluidized bed reactor of claim 1, wherein more than two reaction gas openings are present, each reaction gas opening fed by a respective Laval nozzle, and wherein two or more of the reaction gas openings together with their individual respective Laval nozzles constitute a reaction gas group, the Laval nozzles of which are in turn fed by a common Laval nozzle located upstream of the reaction gas openings and respective Laval nozzles.

6. The fluidized bed reactor of claim 1, wherein at least one opening in the reactor base for fluidizing gas is preceded upstream by a Laval nozzle.

7. The fluidized bed reactor of claim 2, wherein at least one opening in the reactor base for fluidizing gas is preceded upstream by a Laval nozzle.

8. The fluidized bed reactor of claim 3, wherein at least one opening in the reactor base for fluidizing gas is preceded upstream by a Laval nozzle.

9. A method for the production of granular polysilicon, comprising feeding a fluidizing gas and a mass stream of a silicon-containing gas into a fluidized bed of granular polysilicon contained within an inner reaction tube of a fluidized bed reactor while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

10. The method of claim 9, wherein the fluidizing gas comprises $H_2$ and the silicon-containing reaction gas comprises trichlorosilane.

11. A method for the production of granular polysilicon, comprising feeding a fluidizing gas and a mass stream of a silicon-containing gas into a fluidized bed of granular polysilicon contained within an inner reaction tube of a fluidized bed reactor of claim 1, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

12. A method for the production of granular polysilicon, comprising feeding a fluidizing gas and a mass stream of a silicon-containing gas into a fluidized bed of granular polysilicon contained within an inner reaction tube of a fluidized bed reactor of claim 2, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

13. A method for the production of granular polysilicon, comprising feeding a fluidizing gas and a mass stream of a silicon-containing gas into a fluidized bed of granular polysilicon contained within an inner reaction tube of a fluidized bed reactor of claim 3, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

14. A method for the production of granular polysilicon, comprising feeding a fluidizing gas and a mass stream of a silicon-containing gas into a fluidized bed of granular polysilicon contained within an inner reaction tube of a fluidized bed reactor of claim 4, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

15. A method for the production of granular polysilicon, comprising feeding a fluidizing gas and a mass stream of a silicon-containing gas into a fluidized bed of granular polysilicon contained within an inner reaction tube of a fluidized bed reactor of claim 5, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

16. A method for the production of granular polysilicon, comprising feeding a fluidizing gas and a mass stream of a silicon-containing gas into a fluidized bed of granular polysilicon contained within an inner reaction tube of a fluidized bed reactor of claim 6, while maintaining the temperature of the fluidized bed at between 850° C. and 1200° C. whereby silicon is deposited on granules in the fluidized bed in polycrystalline form, continuously adding silicon seed particles to the reactor, and continuously withdrawing a granular polysilicon product, wherein the silicon-containing reaction gas is fed to at least two reaction gas openings in a reactor base of the inner reaction tube, the at least two reaction gas openings preceded upstream by at least one Laval nozzle which supercritically expands the mass stream of silicon-containing reaction gas.

* * * * *